United States Patent [19]

Furuya et al.

[11] 3,973,713

[45] Aug. 10, 1976

[54] WIRE BONDING SYSTEM

[75] Inventors: Teruo Furuya, Kodaira; Jun Suzuki, Higashimurayama; Michio Tanimoto, Kokubunji, all of Japan

[73] Assignee: Hitachi, Ltd., Japan

[22] Filed: Nov. 14, 1974

[21] Appl. No.: 523,800

[30] Foreign Application Priority Data

Nov. 14, 1973 Japan.............................. 48-127304

[52] U.S. Cl................................. 228/102; 228/4.5; 228/7
[51] Int. Cl.²......................................... H01L 21/92
[58] Field of Search ............ 29/589, 590, 591, 528, 29/471.1, 471.3; 228/3–6, 7–9, 102, 179

[56] References Cited
UNITED STATES PATENTS 3,641,660   2/1972   Adams et al....................... 29/471.1

*Primary Examiner*—Al Lawrence Smith
*Assistant Examiner*—K. J. Ramsey
*Attorney, Agent, or Firm*—Craig & Antonelli

[57] ABSTRACT

A wire bonding system connects wires between electrode pads on a semiconductor pellet fixed on a lead frame to the corresponding lead parts on the lead frame. The lead frame with the pellet fixed thereon is first set in a position beneath a projector, to obtain a magnified image of the pellet, from which the position of the pellet is measured. On the basis of the measured value, a computer calculates positions for bonding the wires. The lead frame with the pellet therein is then set on the wire bonding machine and the positions of the bonding head are controlled using the result of said calculation to carry out wire bonding. The position measuring means is separate from the bonding machine, with an on-line or off-line connection therebetween.

17 Claims, 8 Drawing Figures

3,973,713

WIRE BONDING SYSTEM

BACKGROUND OF THE INVENTION

This invention relates to a wire bonding system and, more particularly, to a wire bonding system which permits automatic bonding of wires between the bonding pads on a pellet and the corresponding lead portions.

In order to carry out bonding between leads and electrode pads formed on a semiconductor pellet, there has hitherto been adopted a method in while an operator performs the operation which observing, with a microscope, the position of the workpieces to carry out the bonding. In such a method, however there are disadvantages in that the speed of the bonding operation is rather slow, mistakes in operation are likely to occur, and the operator is subjected to fatigue.

To avoid such disadvantages, attempts to automate the bonding operation have been considered.

For instance, in the bonding method disclosed in Japanese Patent Publication 37788/72, the portion on which the bonding operation is to be carried out is projected as a magnified portion on the display surface of a cathode ray tube and the coordinates of the bonding position are read out to control the head of a bonding tool to carry out wire bonding. In accordance with the method, mentioned above, however, it is difficult to read out or determine mechanically the position of the pellet and the lead projected as magnified portion on the display surface and, if the reading-out should be carried out by an operator, it will consume a large amount of time and result in a slow down of the operation. Moreover, if the operator is to read the bonding position of the pellet and the lead, a large display surface will be necessary and, such a display surface will be too imprecise to attain good-precision bonding.

Another method is the bonding system described in "Denshi Zairyo ( Electronic Materials, a Japanese publication)", May 1973, pp 38 and 39. In this bonding system, the displacements $\Delta x$, $\Delta y$ and $\Delta \Theta$ of the position on which the semiconductor pellet is fixed or soldered are measured and, from these measured values of the displacement, the suitable movement of the bonding head is calculated to carry out the wire bonding automatically. This system, however, involves the following disadvantages:

1. Since the measuring device for measuring the pellet-fixed position is united with the wire bonding device, so as to carry out both the measurement of the pellet-fixed position and the bonding at the same plate, it is impossible to measure the next position, on which another pellet is fixed, during the wire bonding operation and, accordingly, many operators are required in the case of mass production;

2. For the same reason as 1, in measuring the pellet-fixed position, an ITV camera is fixed and the work-stage having the lead frame mounted on it is moved, so that the work-stage must be returned to the initial position after bonding, if the magazine for the loader and unloader of the lead frame is separate from the work-stage;

3. On the work-stage there must be provided a measuring mechanism for the displacements $\Delta x$, $\Delta y$ and $\Delta \Theta$, as well as a mechanism for feeding the workpiece, thus resulting in such a heavy work stage that it cannot be moved very easily, and moreover, resulting in an inaccurate bonding because the low accuracy of the measuring mechanism on account of such as vibrations during the feeding of the workpiece.

The present invention is intended to eliminate the drawbacks as mentioned above.

BRIEF DESCRIPTION OF THE INVENTION

In accordance with the present invention, the lead frame with a semiconductor pellet fixed thereon is initially set at a position beneath a projector, to obtain a magnified image of the pellet, from which the position of the pellet is measured. On the basis of this measured value, a computer calculates the positions necessary for bonding the wires. The lead frame with the pellet thereon is then placed on the wire bonding apparatus and the positions of the bonding head are controlled using the result of the calculation to effect the wire bonding. The position measuring device is separate from the bonding apparatus, with an on-line or off-line connection therebetween.

DETAILED DESCRIPTION OF THE INVENTION

Figure 1:
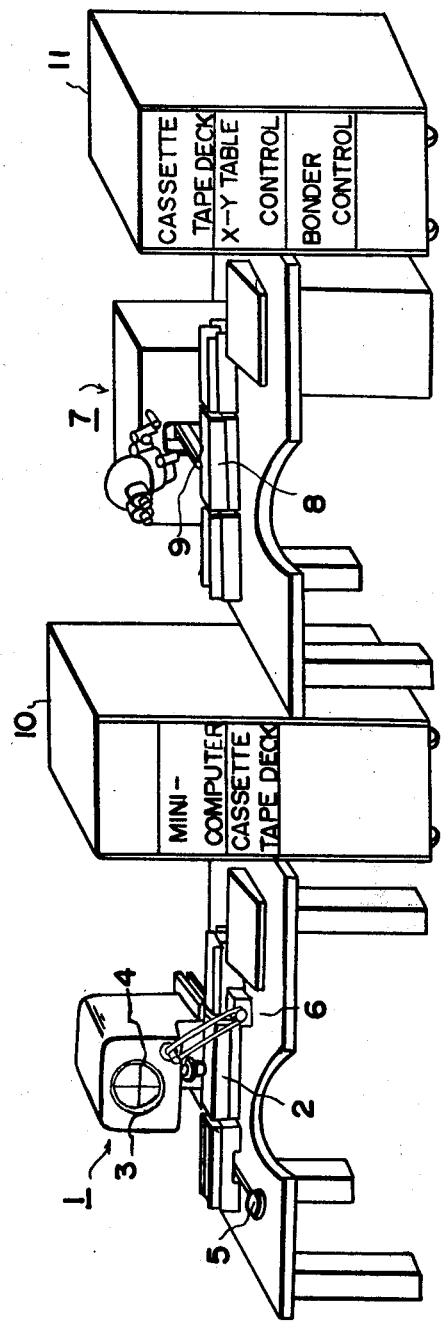
FIG. 1 is a perspective view showing the arrangement of the devices used in the wire bonding system in accordance with the invention.

In FIG. 1, the reference numeral 1 designates generally the measuring device, manufactured by Hitachi, Ltd. a corporation of Japan, for measuring the pellet-mounted position, comprising a display means for displaying a workpiece (a pellet, not shown, fixed on a lead frame) on a display surface 3 as by means of a magnifier projector such as a projector 6T-2 manufactured by Nikon, a corporation of Japan, a work stage 2 on which the work piece is placed, an x-y shifter 5 including joysticks for moving the projector in order to shift the reticle (reference lines) 4 on the display surface 3 in the x-and y- directions, and a $\Theta$ shifter 6 for rotating the screen to shift the reticle in the $\Theta$ -direction (the angular direction). The reference numeral 7 shows generally the wire bonding device, also made by Hitachi, comprising a bonding head 9 designed to move swingingly in the vertical and the horizontal directions to carry out wire bonding. A wire bonding device 7 is provided correspondingly to, but separately from, the position measuring device 1 for constituting a bonding system. The reference numeral 10 shows a mini-computer such as a HITAC-10, also manufactured by Hitachi, for calculating positions on which wires are to be bonded and the numeral 11 shows a numerical control device, made by Hitachi, for controlling the wire bonding device 7.

Figure 2:
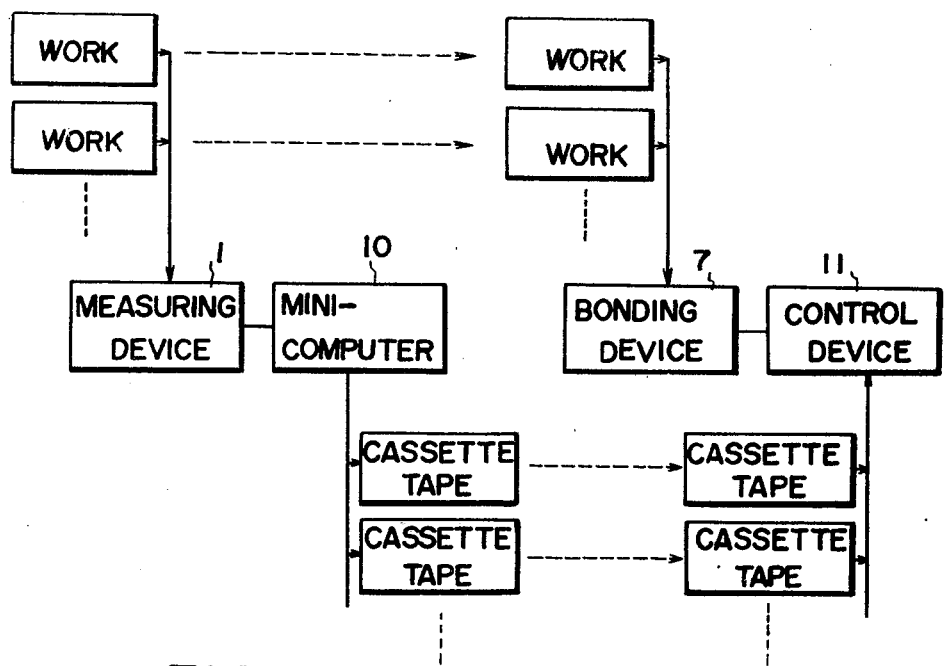
FIG. 2 is a systematic diagram of the bonding system in accordane with the invention.

FIG. 2 shows a system diagram of the bonding system in accordance with the invention. As is shown in FIG. 2, each work piece, which includes a lead frame on which a group of semiconductor pellets are fixed, is set on the position measuring device 1, and the position of each pellet is measured. Electrical signals indicative of the measured positions are applied to the mini-computer 10. In the mini-computer 10, the bonding positions on which wires are to be bonded are calculated for each pellet, as will be subsequently described, and the results of which are recorded in a magnetic tape cassette. Thereafter, each workpiece removed from the measuring device 1 is set on the wire bonding device 7, with the corresponding cassette tape removed from the mini-computer 10 and set on the numerical control device 11, so that the wire bonding device 7 sequentially carries out a wire bonding operation according to the information from the cassette tape.

Since, as shown in FIG. 1, the measuring device 1 and the wire bonding device 7 are separate from each other, the measurement of pellet-bonded positions may be made continuously even during wire bonding operation of the bonding device 7. Accordingly, a plurality of wire bonding devices 7 may be provided, and sets of workpieces, on which the measurement is carried out, and the cassette tapes, which store information indicative of the predetermined and calculated positions, may be distributed among the plurality of wire bonding devices 7. Moreover, many such bonding devices 7 may be controlled by a single operator because the wire bonding device 7 operates fully automatically except for the replacement of and magazines of magnetic tapes for the loader and the unloader.

The position measurement is made indirectly using a reference workpiece since the stroke of the projector as a display is too small to cover both of the pellet and a reference pin of the lead frame used as the origin of the reticle 4.

Figure 3:
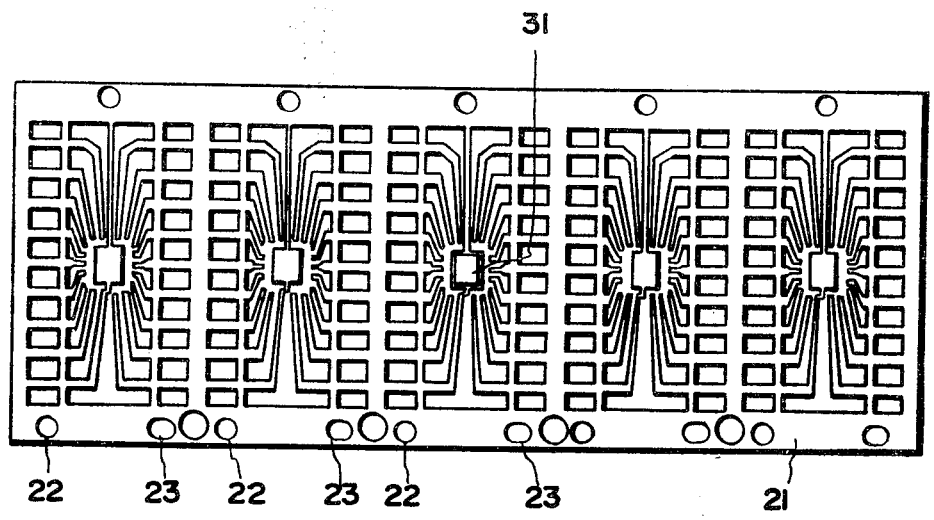
FIG. 3 and FIG. 4 depict the layout of the lead frame and the semiconductor pellet.
Figure 4:
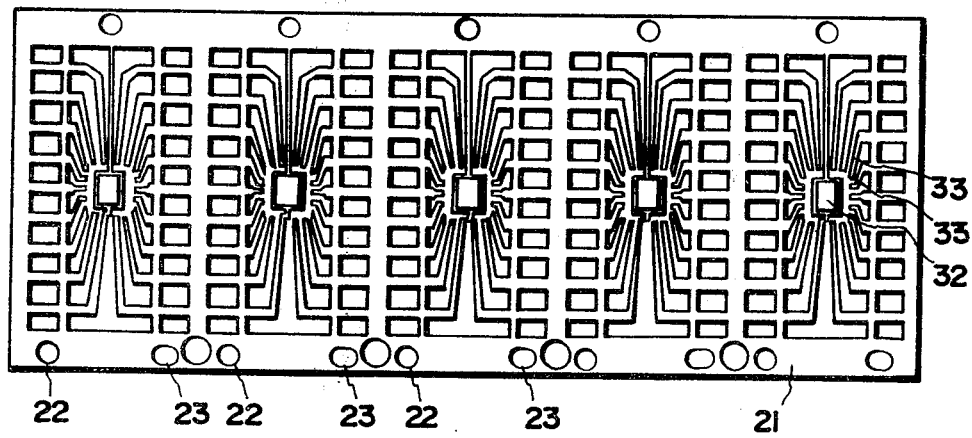

A reference workpiece may have a lead frame 21 and a semiconductor pellet 31 fixed on a part of the lead frame 21 as shown in FIG. 3.

Figure 6:
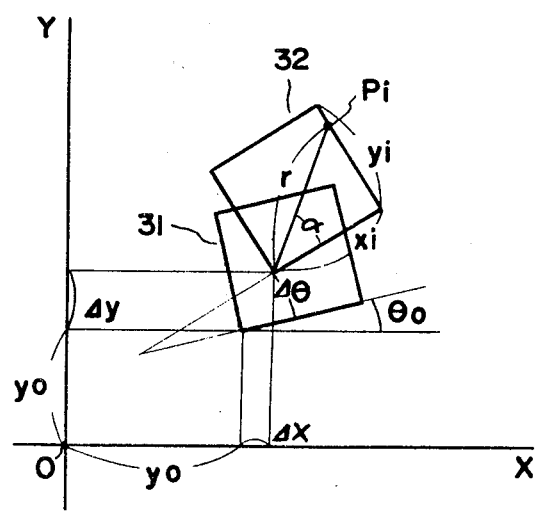
FIG. 6 is a diagram for explaining a specified method of measuring the pellet fixed position and calculating the bonding position by means of a computer.

The reference workpiece is set on the work stage 2 of the position measuring device 1 and the position of the pellet 31, depicted by $x_0, y_0$ and $\Theta_0$, as shown in FIG. 6, is accurately measured.

The origin O of the X-Y co-ordinates may be a central point of a hole 22 for positioning the lead frame 21.

Electrical signals indicative of the measured position of the reference pellet 31 are stored in the mini-computer 10. Electrical signals indicative of standard positions of free ends of the leads 33 as well as electrode pads 34 (shown in FIG. 5) formed on the semiconductor pellet 31 with respect to origin 0 are also stored in the mini-computer 10.

A lead frame 21 having semiconductor pellets 32 thereon, on which wires are to be bonded, is then set on the work stage 2 and differences or displacements $\Delta x$, $\Delta y$ and $\Delta \Theta$ of each pellet 32 in X, Y and $\Theta$ positions with respect to the reference pellet 31 as depicted in FIG. 6 are measured and electrical signals indicative of the measured displacements are supplied in the mini-computer 10.

Figure 5:
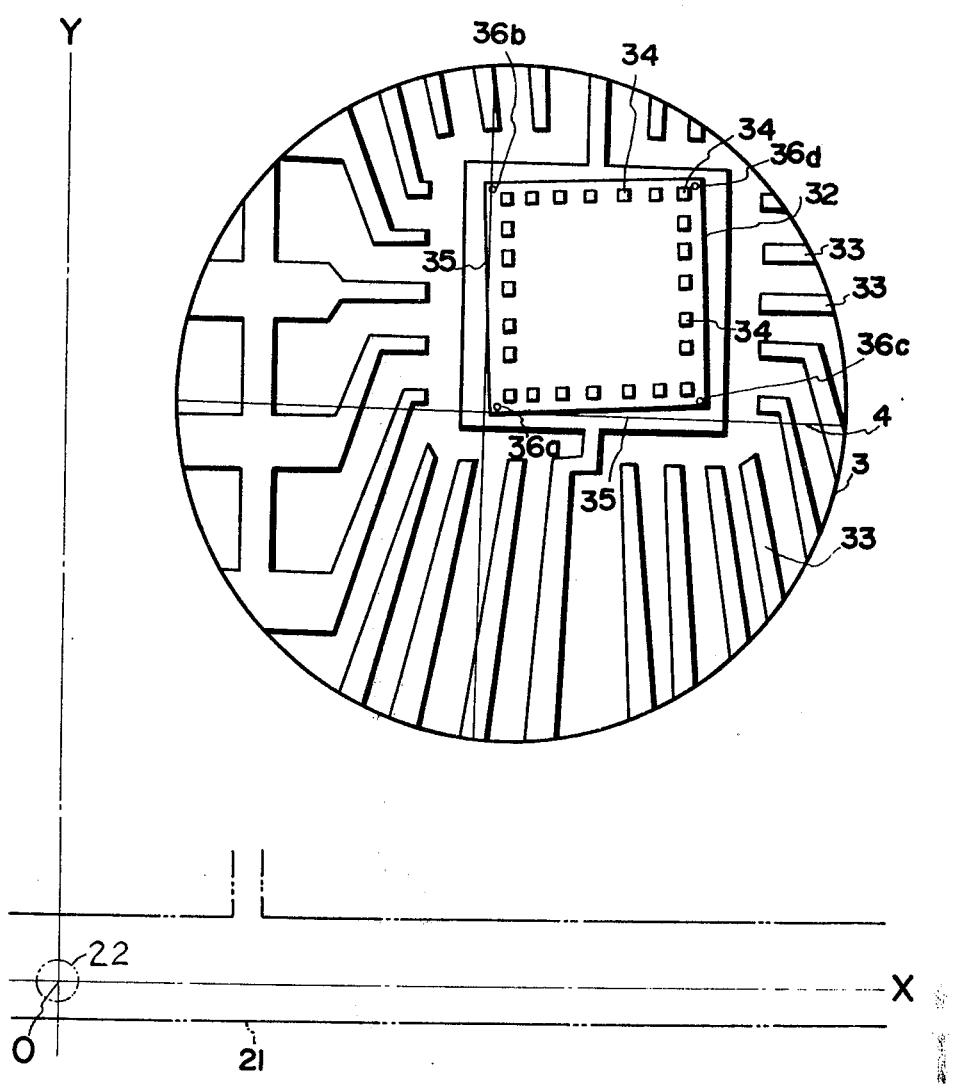
FIG. 5 depicts the upper surface of a semiconductor pellet and leads projected on a projector screen.

FIG. 5 depicts the upper surface of semiconductor pellet 32 and the leads 33 projected on screen 3. The position of the projector is adjusted beforehand so that the reticle 4 coincides with the position of the reference pellet 31.

As references for positioning semiconductor pellets, the periphery lines 35 or electrode pad 34 of the pellet 31 may be used. Otherwise, dots 36a–36d formed on the pellets may be used.

Where a pellet 32 having dots 36a–36d thereon is used, the projector is moved so that dot 36a coincides with the cross point of reticle 4, and dots 36b and 36c fall on the vertical and horizontal lines, respectively. The movement of the projector indicates displacements $\Delta x$, $\Delta y$ and $\Delta \Theta$ of the pellet 32 with respect to the reference pellet 31.

The mini-computer 10 calculates, on the basis of the measured values $\Delta x$, $\Delta y$ and $\Delta \Theta$, the position $(x_{Pi}, y_{Pi})$ of the $i$-th bonding pad Pi on the pellet in accordance with the following equations:

$$\begin{aligned} x_{Pi} &= X_0 + \Delta x + r\cos(\alpha + \Delta\theta + \theta_0) \\ &= x_0 + \Delta x + r\cos\alpha \cdot \cos(\Delta\theta + \theta_0) - r\sin\alpha \cdot \sin(\Delta\theta + \theta_0) \\ &= x_0 + \Delta x + x_i \cos(\Delta\theta + \theta_0) - y_i \cdot \sin(\Delta\theta + \theta_0) \quad (1) \\ y_{Pi} &= y_0 + \Delta y + y_i \cdot \cos(\Delta\theta + \theta_0) + x_i \cdot \sin(\Delta\theta + \theta_0) \quad (2) \end{aligned}$$

where the symbols used in equations (1) and (2) are as shown in FIG. 6.

The position $(x_i, y_i)$ with respect to the origin 0 defining each pad Pi on a standard pellet 31 has been stored in the mini-computer 10 beforehand depending on the kind of product to be manufactured.

On the other hand, the bonding position $(x_{Li}, y_{Li})$ with respect to origin 0 on the free end of each lead 33 corresponding to pad Pi has been stored in the mini-computer 10 according to the kinds of products to be manufactured.

The calculated positions $(x_{Pi}, y_{Pi})$ and $(x_{Li}, y_{Li})$ for each pellet 32 on a lead frame 21 are stored in a cassette type magnetic tape.

The lead frame 21 is removed from the measuring device 1 and set on the bonding apparatus 7, and also the cassette tape is removed fom the mini-computer 10 and set in the bonder control device 11. Next, the bonding apparatus 7 carries out the bonding of a wire between each pad Pi and the corresponding lead 33 automatically, in accordance with information reproduced from the cassette tape by the bonder control 11.

Figure 7:
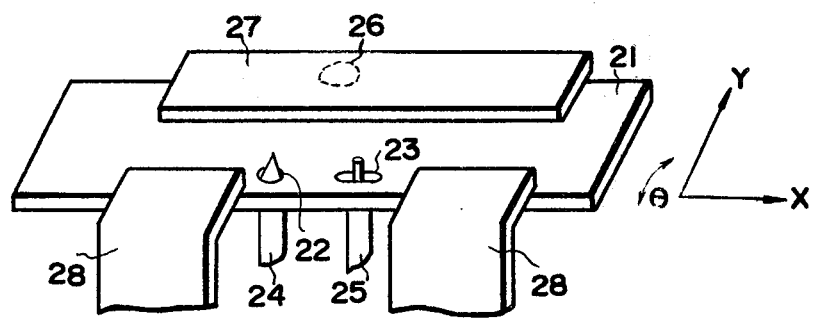
FIG. 7 and FIG. 8 depict the arrangement of the positioning mechanism and a lead frame in accordance with the present invention.
Figure 8:
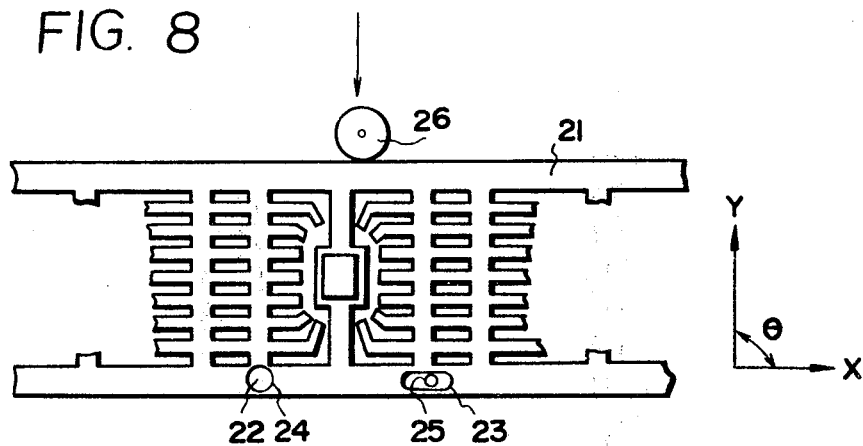

In order to carry out accurate positioning, both the measuring device 1 and the bonding apparatus 7 have the same positioning mechanism as shown in FIGS. 7 and 8.

Lead frame 21 has a circular hole 22 as well as an elongated hole 23 for each pellet 32. By inserting tapered pin 24 in the circular hole 22, a point of the lead frame 21 is fixed for establishing the origin for positioning the lead frame. On the other hand, another pin 25 is inserted in the elongated hole 23, and one edge of lead frame 21 at the opposite side of the holes 22 and 23 is pressed against the pins 24 and 25 by the roller 26. Thus, another point of the lead frame 21 is fixed by the pin 25 and the roller 26. The members 27 and 28 are for forcing down the lead frame 21.

Then, with the thus fixed lead frame 21, measurement of each pellet is carried out in the measuring device 1, or bonding for each pellet is carried out in the bonding apparatus.

Although in the embodiment mentioned above, the operation has been done by an off-line procedure using cassette tapes, on-line operation may be preferred by using memories of large capacity as magnetic discs with the mini-computer 10. With the on-line control of the wire bonding device, it is possible to operate a plurality of wire bonding devices right away on the result of calculation, and to erase information that has become useless after the completion of wire bonding so as to admit the subsequent calculated result into said memory. This reduces the memory capacity as compared with an off-line system.

Although the bonding system in accordance with the invention may be applied to wire bonding in general, it is effective in particular to elements with a large number of bonding positions such as LSI.

In accordance with the wire bonding system of the invention, as described above, the pellet-fixed position measuring device and the wire bonding device are separate from each other, so that during the operation of the wire bonding device, the pellet fixed position measuring device may be operated to measure the pellet-fixed positions thereby to enhance the efficiency of wire bonding. Also, because of the separation of the wire bonding device from the position measuring device and, hence, the control of the movement of the bonding head in response to the result of calculation, it is not necessary to provide the lead frame holder in the wire bonding device with such a manipulator to be used for position modification or position measurement, thereby improving the rigidity of the wire bonding device to permit a high speed wire bonding operation.

Since a single mini-computer is used to calculate the bonding positions for a plurality (for example 10 to 20) of wire bonding devices, provision of a control means for the bonding head is sufficient for the bonding device, without the necessity of the provision of a calculating means, and as a result, it is possible to provide a simple and inexpensive wire bonding device. The pellet fixed position measurement can very easily be made only by bringing the reticle into alignment with the pellet. Since the pellet position measuring device and the wire bonding device are separate from each other, it is possible to move the projector and screen while the pellet is held still and, because of this, such problems as the loss of time arising in moving the work stage or decrease in measurement accuracy has been avoided with certainty.

While we have shown and described an embodiment in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

We claim:

1. A wire bonding system for connecting with wires between electrodes on a pellet fixed on a lead frame and lead portions in said lead frame, comprising:
   position measurement means for measuring a reference position of the lead frame;
   calculating means for calculating each bonding position of said electrodes and said lead portions relative to said reference position on the basis of the result of said measurement; and
   wire bonding means provided separately from said position measurement means,
   said wire bonding means including means for positioning a bonding head of said wire bonding means in accordance with the calculated bonding positions from said calculating means to carry out the connection with a wire between each said electrode and lead portion.

2. A wire bonding system as claimed in claim 1, in which the position measurement means includes means for moving said position measurement means such that the measurement of the reference position on the pellet relative to the reference position of the lead frame is carried out while the lead frame is fixed.

3. A wire bonding system for connecting wires between electrodes on a pellet fixed on a lead frame and lead positions in said lead frame, comprising:
   position measurement means for measuring a reference position on the pellet relative to a reference position of the lead frame;
   calculating means for calculating each bonding position of said electrodes and said lead positions relative to the reference position of the lead frame on the basis of the result of said measurement;
   memory means for memorizing the calculated bonding positions;
   wire bonding means provided separately from said measurement means, said wire bonding means having a bonding head,
   said wire bonding means including means for positioning said bonding head in accordance with information derived from said memory means to carry out the connection with wires between said electrodes and said lead positions.

4. A wire bonding system as claimed in claim 3, in which the bonding head in the wire bonding means is positioned under on-line control based on said result of measurement.

5. A wire bonding system as claimed in claim 3, in which each bonding head is positioned with respect to the lead position on the basis of fixed data inherently predetermined by said reference position of said lead frame.

6. A wire bonding system as claimed in claim 3, in which positioning means are provided for positioning said lead frame with respect to each of said position measurement means and said wire bonding means.

7. A wire bonding system as claimed in claim 6, in which said positioning means includes a first pin member insertable into a first aperture of said lead frame for fixing a first position point of said lead frame, a second pin member insertable into a second aperture of said lead frame, and means for pressing said lead frame against said first and second pin members for fixing a second position point of said lead frame by said second pin member and said pressing means.

8. A wire bonding system as clamed in claim 7, in which said first aperture is circular and said second aperture is elongated.

9. A wire bonding system as claimed in claim 7, in which said pressing means includes a roller member rotatably pressing against said lead frame at a side portion of said lead frame opposite said first and second apertures.

10. A wire bonding system as claimed in claim 3, in which said memory means includes cassette tapes, and in which said lead frame is supported in a lead frame magazine, said cassette tapes and said lead frame magazine being removed to said wire bonding means for carrying out the wire connections between said electrodes and said lead positions.

11. A wire bonding system as claimed in claim 3, in which said position measurement means includes a reference workpiece having a reference pellet fixed to a lead frame at a predetermined position, said predetermined position being stored in said calculating means for calculating said bonding positions with reference to said predetermined position.

12. A wire bonding system as claimed in claim 3, in which said wire bonding means includes a plurality of bonding heads for carrying out a plurality of connecting operations with respective measured bonding positions by a single one of said position measurement means.

13. A wire bonding system as claimed in claim 3, in which said position measurement means includes display means for displaying at least a portion of said pellet fixed to said lead frame, said display means including a screen and a reticle disposed on said screen, projector means for projecting an image of said portion to said display means, means for moving said projector means, and means for rotating said screen and reticle.

14. A wire bonding system as claimed in claim 3, in which each of said position measurement means, calculating means, memory means, and wire bonding means are disposed in independent devices having separated locations.

15. A wire bonding system as claimed in claim 1, in which each of said position measurement means, calculating means and wire bonding means are disposed in independent devices having separated locations.

16. A wire bonding method for making integrated circuit devices comprising the steps of:

a. arranging a lead frame on a position measuring device, said lead frame having a plurality of locations each having a portion on which a semiconductor pellet with a plurality of electrode pads on the upper surface thereof is fixed and a plurality of lead portions, b. measuring respectively deviations in position of the plurality of fixed pellets with respect to a predetermined reference position while maintaining said lead frame with said fixed pellets relatively fixed during the measuring step, c. storing information of position for said each pellet based on the measured deviations, d. removing said lead frame from said position measuring device, e. arranging said lead frame on an independent wire bonding device separated from said position measuring device, and then f. sequentially carrying out wire bonding operations between each of said electrode pads and each corresponding lead portion of said plurality of locations in accordance with said stored information.

17. A wire bonding method according to claim 16, wherein said measuring device has a projecting means including a screen for displaying at least a portion of each respective pellet, and said deviation in position of said pellet is measured by horizontally moving said projecting means and by rotating said screen.

* * * * *